United States Patent [19]

Carroll

[11] Patent Number: 5,130,571
[45] Date of Patent: Jul. 14, 1992

[54] OPTIMIZING SPEED AND CHARGE INJECTION PARAMETERS OF A SWITCHED CAPACITOR CIRCUIT

[75] Inventor: Kenneth J. Carroll, San Jose, Calif.
[73] Assignee: Ventritex, Sunnyvale, Calif.
[21] Appl. No.: 575,065
[22] Filed: Aug. 29, 1990
[51] Int. Cl.$^5$ .................. H03K 5/159; G06G 7/12
[52] U.S. Cl. .................. 307/352; 307/353; 307/491; 307/572; 307/246
[58] Field of Search ............. 307/352, 353, 491, 572, 307/246

[56] References Cited

U.S. PATENT DOCUMENTS 4,308,468 12/1981 Olson .................................. 307/353

Primary Examiner—Eugene R. LaRoche
Assistant Examiner—Michael B. Shingleton
Attorney, Agent, or Firm—Limbach & Limbach

[57] ABSTRACT

A switched capacitor circuit that uses more than one switch in parallel. The control signals of each switch are turned off in sequence, giving an induced offset voltage in the final case due only to the last turned off switch, but with a capacitor charge or acquisition time due to the parallel combinations of all of the switches. An alternative switch capacitor circuit uses a bootstrapped gatedrive control signal. The gatedrive control signal initially assumes a high value resulting in a low switch resistance and, thus, a fast capacitor charge or acquisition time followed by a reduction in voltage to the normal "digital" level until turn off. The resultant induced offset voltage is the same as that due to a simple minimum sized switch.

6 Claims, 3 Drawing Sheets ns of this invention will be obtained by refer-

OPTIMIZING SPEED AND CHARGE INJECTION PARAMETERS OF A SWITCHED CAPACITOR CIRCUIT

BACKGROUND OF THE INVENTION

1. Field of the Invention

The present invention relates to switched capacitor circuits and, in particular, to circuits and methods for decreasing the charge time of a switched capacitor circuit while not increasing switch induced charge injection.

2. Discussion of the Prior Art.

A typical sample and hold, switched capacitor circuit 10 is shown in FIG. 1. In the Fig. 1 circuit 10, an n-channel transistor M1 is connected between the input $V_{IN}$ and the output $V_{OUT}$. A capacitor $C_S$ is connected between the output $V_{OUT}$ and ground. A control signal CONTROL drives the gate of transistor M1.

Since transistor MI may be thought of as an equivalent resistor $R_{eq}=R(M1)$ for $V_{IN} < V_{CONTROL} - V_{tn}$, the switched capacitor circuit 10 shown in FIG. 1 may be illustrated as an RC circuit 10' during a sample time $t_s$, as shown in FIG. 2.

Referring to the timing waveforms shown in FIG. 3, when the control signal CONTROL is held on for the sample time $t_s$, the sample held output $V_{OUT}$ approaches $V_{IN}$ in an exponential fashion. The time constant is determined by the resistance $R_{eq}$ and the capacitance $C_S$. At time $t_s$, the n-channel switch M1 is turned off. Due to the charge resident in the channel of transistor M1 at turnoff and the gate/channel overlap capacitor, an offset voltage $V_{OF}$ is induced. The parameter $t_s$ is chosen such that, in the worst case scenario, $V_{OUT}$ will become equal to $V_{IN}$ to within a small tolerance, for example 0.1%.

The constraints of acquisition time and charge injection make opposite demands on the sample switch. A fast acquisition time requires a sample switch M1 having a large channel width/channel length ratio (W/L) for a low RC time constant with the sample capacitor. However, a large W/L ratio switch requires a physically large channel which gives it a large stored channel charge and a large overlap capacitor formed by the channel width times the gate channel overlap (W*$L_{OVLP}$). This results in a larger induced offset voltage than for a smaller switch using identical charge injection cancellation techniques.

Low offset voltage, therefore, requires a small switch M1. However, in many cases, this switch may have too high a channel resistance to charge the sample capacitor in the given acquisition time $t_s$ to the required tolerance.

SUMMARY OF THE INVENTION

The present invention provides a switched capacitor circuit that uses more than one switch in parallel. The control signals of each switch are turned off in sequence giving an induced offset voltage in the final case due only to the last turned off switch, but with a capacitor charge or acquisition time due to the parallel combinations of all of the switches.

A sample and hold switched capacitor circuit in accordance with this embodiment of the invention responds to an input signal applied at its input node by providing a corresponding output voltage at its output node via a capacitor connected between the output node and ground. The circuit includes a first n-channel transistor which is connected between the input node and output node. The n-channel transistor is driven by a first control signal applied to its gate for a first time period. A second n-channel transistor is connected in parallel with the first transistor between the input node and the output node. The second transistor is driven by a second control signal applied to its gate for a second time period which is greater than the first time period. The W/L ratio of the first transistor is equal to or greater than the W/L ratio of the second transistor.

In an alternative embodiment of the invention, a switched capacitor circuit uses a bootstrap gate drive control signal. The control signal initially assumes a high value, resulting in a low switch resistance. This results in a fast acquisition time followed by a reduction in voltage to the normal "digital" level until turn off where the resultant induced offset voltage is the same as that due to a simple minimum sized switch. The circuit responds to an input signal applied to its input node by providing a corresponding output voltage at its output node via a capacitor connected between the output node and ground. The circuit includes an n-channel transistor connected between the input node and the output node. The control signal is applied to the gate of the n-channel transistor for a first time period, during which the voltage level of the control signal is maintained at a first voltage value. At the end of the first time period, the control signal is reduced in voltage to a second voltage level which is less than the first voltage value.

A better understanding of the features and advantages of the present invention will be obtained by reference to the following detailed description of the invention and accompanying drawings which set forth illustrative embodiments in which the principles of the invention are utilized.

DETAILED DESCRIPTION OF THE INVENTION

Figure 1:
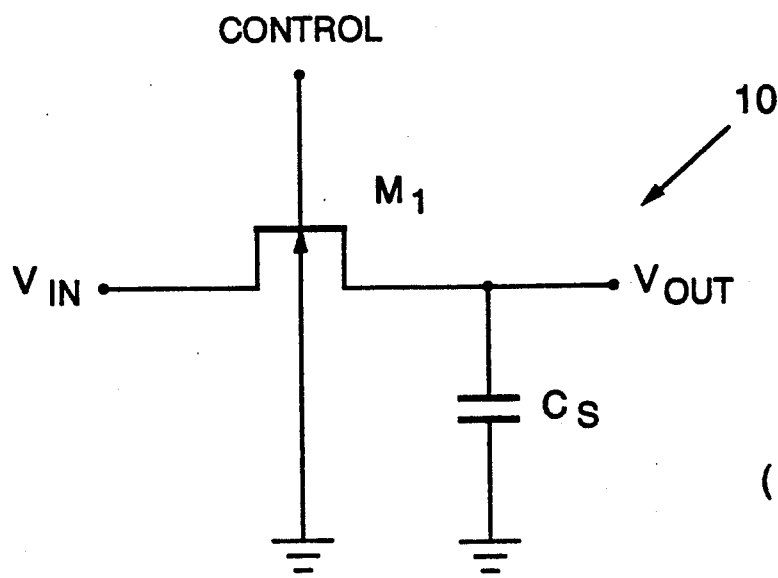
FIG. 1 is a schematic diagram illustrating a conventional sample and hold, switched capacitor circuit.
Figure 2:
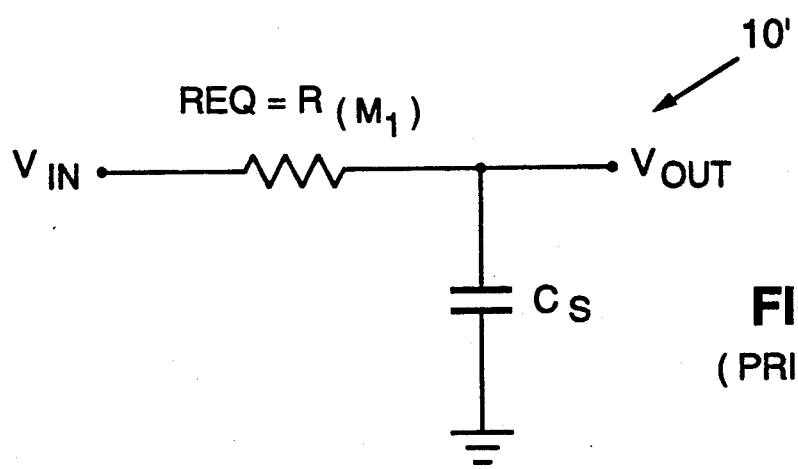
FIG. 2 is a simple schematic diagram illustrating substitution of equivalent resistor $R_{eq}$ for switch M1 in the FIG. 1 circuit.
Figure 3:
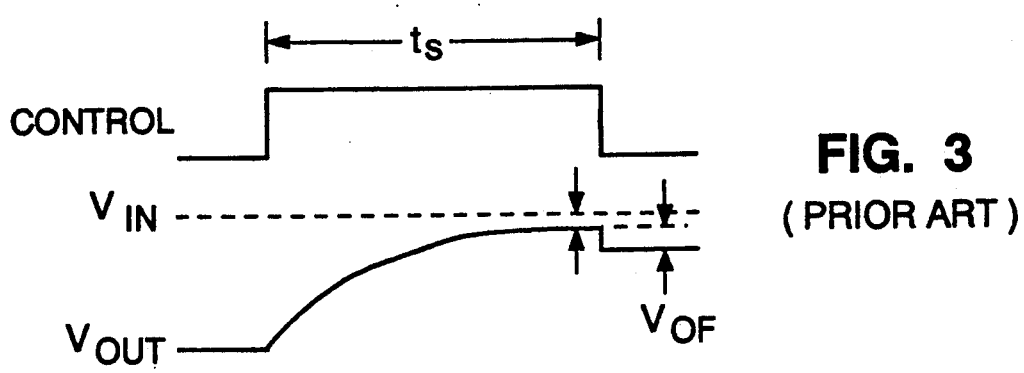
FIG. 3 shows an output waveform for the FIG. 1 circuit for a sample time $t_s$.
Figure 4:
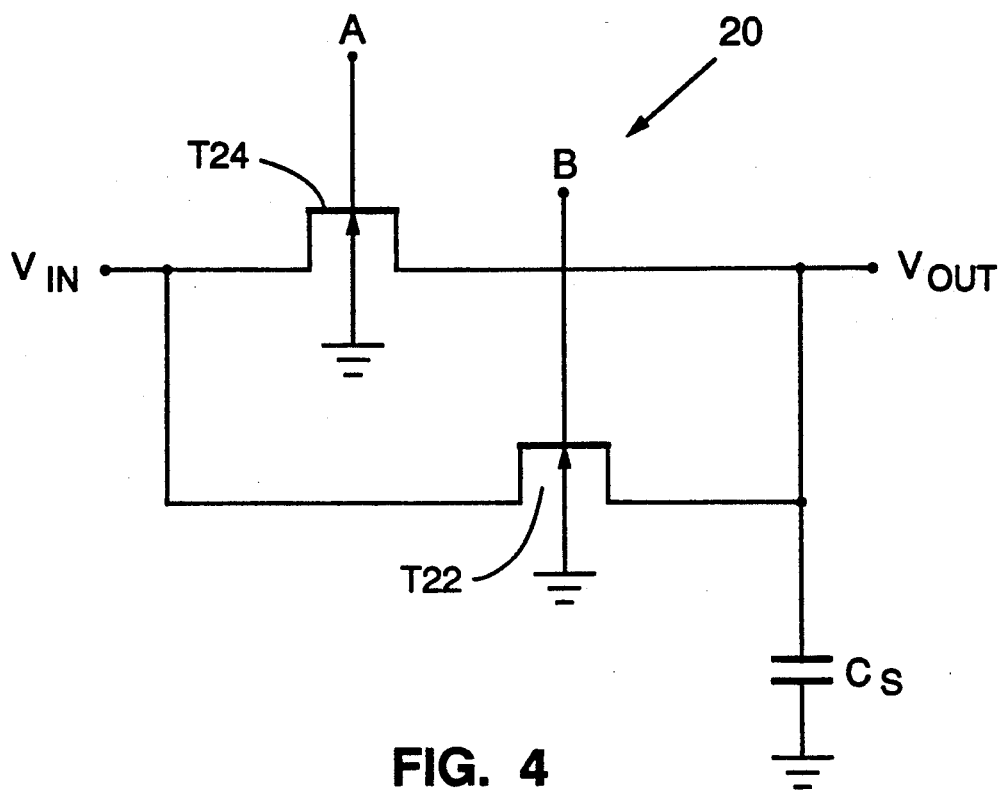
FIG. 4 is a schematic diagram illustrating an embodiment of a sample and hold, switched capacitor circuit in accordance with the present invention.

FIG. 4 shows a sample and hold, circuit 20 in which a small W/L ratio transistor T22 and an equal in parallel, replacing the single device M1 of the FIG. 1 circuit. The necessary sample signals, A and B, which drive the gate of transistor T24 and the gate of transistor T22, respectively, are shown in FIG. 5, together with the waveform of the resultant output signal $V_{OUT}$.

Both transistors T22 and T24 may turn on simultaneously under the "sample" command. The RC time constant of the circuit 20 will have decreased from the R(M1) * $C_s$ of the FIG. 1 circuit to the parallel combination of (R22*R24/(R22+R24))*$C_s$ for the "$t_1$" period. If transistor T24 is a larger device, i.e. the W/L ratio of transistor 24 is greater than the W/L ratio of transistor 22, then this term approximates (R24) $C_S$.

Figure 5:
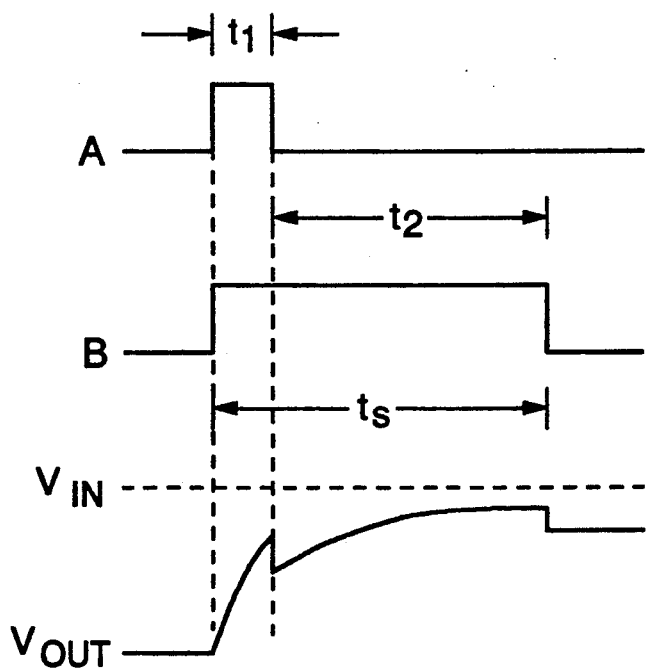
FIG. 5 shows a control signal waveform and corresponding output waveform for the FIG. 4 circuit.

As shown in FIG. 5, transistor T24 turns off first. Because transistor T22 is still on, the large charge injected by transistor T24 will be partially absorbed by transistor T22 and the signal source during the duration of the sample time $t_s$. For time $t_2$, the charging profile is the same as that for the FIG. 1 circuit. At time $t_s$, when transistor T22 finally turns off, the total induced charge due to the combination of transistors T22 and T24 will be T22$_3$s only.

Therefore, the circuit 20 provides a fast acquisition due to transistor T24 and capacitor $C_s$, but the low offset voltage of the T22/$C_s$ combination.

Figure 6:
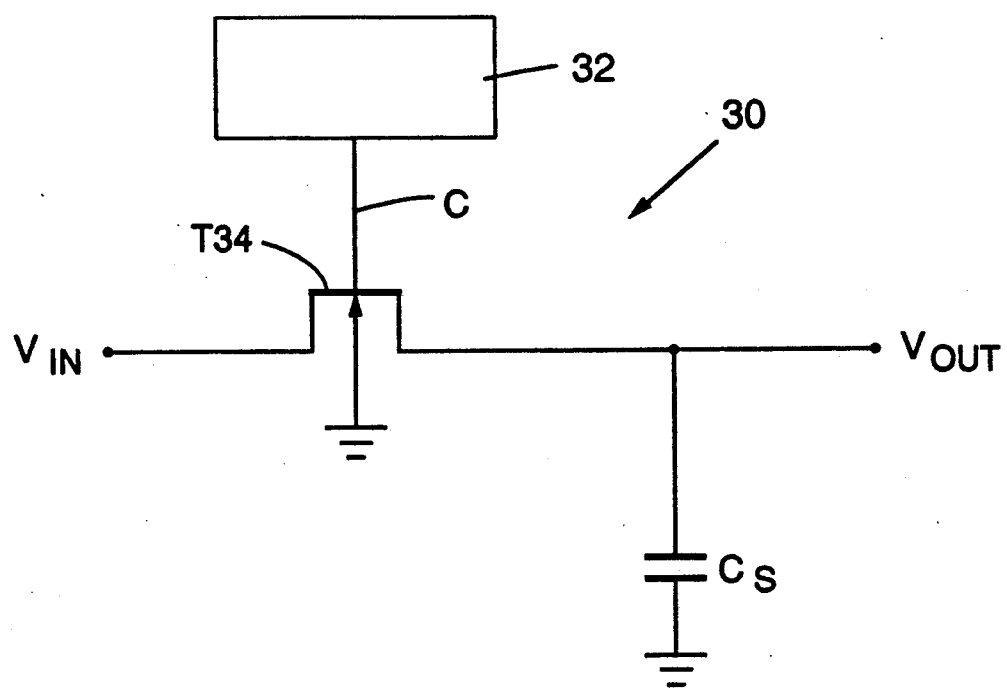
FIG. 6 is a schematic diagram illustrating an alternative embodiment of a sample and hold, switched capacitive circuit in accordance with the present invention.
Figure 7:
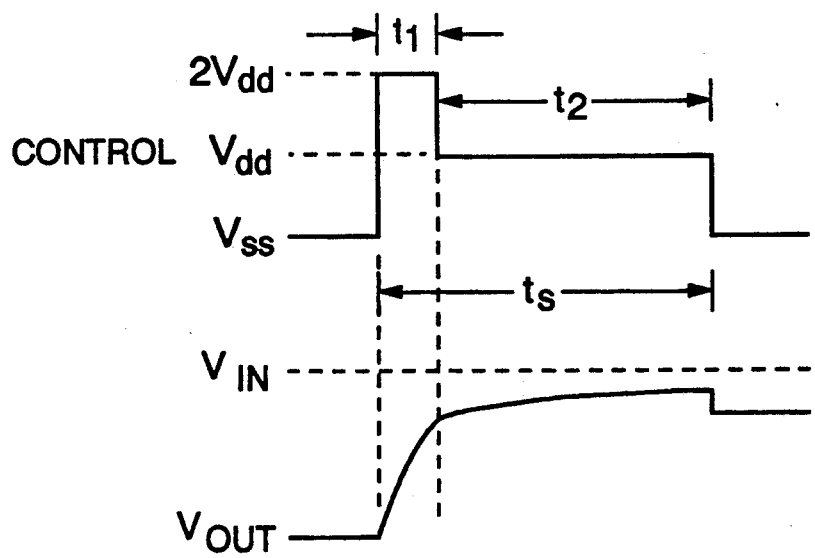
FIG. 7 shows a two-stage control signal waveform and corresponding output waveform for the FIG. 6 circuit.

FIG. 6 shows an alternative circuit 30 in which the original slow, but low offset circuit 10 of FIG. 1 is used, but with a bootstrap gate drive signal control waveform as shown in FIG. 7.

The FIG. 7 sample control waveform C may be generated by a conventional bootstrapped circuit 32 in which voltages of typically twice the positive supply $V_{dd}$ are generated in a transient fashion. The two-stage waveform C decreases the channel resistance of the n-channel switch T34 beneath that of the switch M1 in FIG. 1 for the "2$V_{dd}$", $t_1$ period. This provides an initial low RC time constant. The circuit 30 then reverts to the FIG. 1 circuit configuration for the remainder of the sample period $t_s$, ($t_2$) This reduction to $V_{dd}$ on the control signal C allows the extra channel charge stored by the high gate drive to be absorbed by the signal source, thus emulating the FIG. 4 circuit 20 in that partial elimination of the offset due to device T34 at $t_1$ is accomplished.

The final turnoff from $V_{dd}$ to ground results in the same injected charge as in the original FIG. 1 circuit 10. The resulting charging profile is similar to that of the FIG. 4 circuit 20.

In general, the switches of the FIG. 4 and FIG. 6 circuits will operate in their linear or resistive region. Therefore, the channel resistance of transistor T34 in FIG. 6 will be decreased by about 50% for a boost voltage of 2$V_{dd}$. This, of course, will translate into a halving of the RC product during time $t_1$.

In the FIG. 4 embodiment, the initial RC can be tailored by using different size transistors for the switch T24. The only restriction is that the turnoff transient induced by transistor T24 must leave the charging curve above where it would be in the case of the FIG. 1 circuit 10, since the RC products are identical in time $t_2$ for all of the above-described circuits.

The FIG. 4 circuit 20 has the advantage of simplicity, requiring only one extra switch and an extra sample phase. The FIG. 6 circuit 30 has the advantage of not placing another drain/source junction on the sample capacitor $C_s$. All other things being equal, the FIG. 6 circuit 30 has a superior hold time due to the reduced junction leakage.

It should be understood that various alternatives to the embodiments of the invention described herein may be employed in practicing the invention. For example, p-channel switches or transmission gates may be substituted for the n-channel switches utilized in the above-described embodiment of the invention. Furthermore, the techniques discussed above apply to all switched capacitor type circuits such as charge redistribution analog-to-digital converters, charge redistribution digital-to-analog converters and switched capacitor filters. It is intended that the following claims define the scope of the invention and that circuit structures within the scope of these claims and their equivalents be covered thereby.

What is claimed is:

1. A switched capacitor circuit that includes an input node and an output node and that responds to an input signal applied at the input node by providing a corresponding output voltage at its output node via a capacitor connected between the output node and ground, the switched capacitor circuit comprising:
   (a) a first switch connected between the input node and the output node, the first switch being driven by a first control signal applied to the first switch for a first time period; and
   (b) a second switch connected in parallel with the first switch between the input node and the output node, the second switch being driven by a second control signal applied to the second switch for a second time period which is greater than the first time period.

2. A switched capacitor circuit that includes an input node and an output node and that responds to an input signal coupled at its input node by providing a corresponding output voltage at its output node via a capacitor connected between the output node and ground, the switched capacitor circuit including a switch coupled between the input node and the output node and which is driven by a control signal, the control signal having a first voltage value to close the switch for a first time period and a second voltage value to close open the switch for a second time period, the second voltage value being less than the first voltage value.

3. A switched capacitor circuit includes an input node and an output node and that responds to an input signal applied at its input node by providing a corresponding output voltage at its output node via a capacitor connected between the output node and ground, the switched capacitor circuit comprising:
   a) a first n-channel transistor connected between the input node and the output node, the first transistor being driven by a first control signal applied to its gate for a first time period; and
   b) a second n-channel transistor connected in parallel with the first transistor between the input node and the output node, the second transistor being driven by a second control signal applied to its gate for a second time period which is greater than the first time period, the W/L ratio of the second transistor being equal to or less than the W/L ratio of the first transistor.

4. A switched capacitor circuit includes an input node and an output node and that responds to an input signal coupled at its input node by providing a corresponding output voltage at its output node via a capacitor connected between the output node and ground, the switched capacitor circuit including an n-channel transistor coupled between the input node and the output node and which is driven by a control signal applied at its gate, the control signal having a first voltage value that turns on the transistor for a first time period and a second voltage value that turns on the transistor for a second time period, the second voltage value being less than the first voltage value.

5. A switched capacitor circuit includes an input node and an output node and that responds to an input signal applied at its input node by providing a corresponding output voltage at its output node via a capacitor connected between the output node and ground, the switched capacitor circuit comprising:

(a) a first p-channel transistor connected between the input node and the output node, the first transistor being driven by a first time control signal applied to its gate for a first time period; and (b) a second p-channel transistor connected in parallel with the first transistor between the input node and the output node, the second transistor being driven by a second control signal applied to its gate for a second time period which is greater than the first time period, the W/L ratio of the second transistor being equal to or less than the W/L ratio of the first transistor.

6. A switched capacitor circuit that includes an input node and an output node and that responds to an input signal coupled at its input node by providing a corresponding output voltage at its output node via a capacitor connected between the output node and ground, the switched capacitor circuit including a P-channel transistor coupled between the input node and the output node and which is driven by a control signal applied at its gate, the control signal having a first voltage value that turns on the transistor for a first time period and a second voltage value that turns on the transistor for a second time period, the second voltage value being less than the first voltage value.

* * * * *